(12) United States Patent
Rosenau et al.

(10) Patent No.: US 6,879,032 B2
(45) Date of Patent: Apr. 12, 2005

(54) FOLDED FLEX CIRCUIT INTERCONNECT HAVING A GRID ARRAY INTERFACE

(75) Inventors: Steven A. Rosenau, Mountain View, CA (US); Mohammed E. Ali, Sunnyval, CA (US); Brian E. Lemoff, Union City, CA (US); Lisa A. Windover, San Francisco, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 10/623,304

(22) Filed: Jul. 18, 2003

(65) Prior Publication Data

US 2005/0012199 A1 Jan. 20, 2005

(51) Int. Cl.[7] .............................................. H01L 23/48
(52) U.S. Cl. ........................ 257/696; 257/700; 257/703
(58) Field of Search ................................ 257/696, 688, 257/685, 692, 700, 703, 706; 361/718, 719, 748, 750, 751; 174/254, 260, 261

(56) References Cited

U.S. PATENT DOCUMENTS

| | | | |
|---|---|---|---|
| 4,716,500 A | 12/1987 | Payne | |
| 4,902,236 A | 2/1990 | Hasircoglu | |
| 5,776,797 A * | 7/1998 | Nicewarner et al. | 438/107 |
| 6,208,521 B1 * | 3/2001 | Nakatsuka | 361/749 |
| 6,300,679 B1 | 10/2001 | Mukerji et al. | |
| 6,310,392 B1 | 10/2001 | Burns | |
| 6,326,554 B1 | 12/2001 | Gillette et al. | |
| 6,444,921 B1 * | 9/2002 | Wang et al. | 174/260 |

OTHER PUBLICATIONS

Kirk Giboney et al., "Next Generation Parallel–Optical Data Links", IEEE Lasers and Electro–Optics Society 2001 Annual Meeting, San Diego, CA, Nov. 12–15, 2001.
Jeff Strole et al., "A Novel Flex Circuit Area–Array Interconnect System for a Catheter–Based Ultrasound Transducer", IMAPS 2002, Denver, CO, Sep. 5, 2001.

* cited by examiner

*Primary Examiner*—Nathan J. Flynn
*Assistant Examiner*—Leonardo Andújar

(57) ABSTRACT

A folded flex circuit interconnect increases a number of interconnection pads of a grid array interface available to accommodate high count outputs from distinct circuit elements. The circuit interconnect includes a substrate capable of being folded, a conductor layer adjacent to a surface of the substrate, and a pad array having an interconnection pad connected to the conductor layer at a first end of the circuit interconnect. The pad array is part of the grid array interface. An optics module includes the folded flex circuit interconnect and an optical unit. The folded flex circuit interconnect further includes an electrical interface at a second end that is connected to the conductor layer. The folded flex circuit interconnect connects to the optical unit using the electrical interface. The circuit interconnect connects the optical unit to a motherboard using the pad array at the first end.

29 Claims, 8 Drawing Sheets

FOLDED FLEX CIRCUIT INTERCONNECT HAVING A GRID ARRAY INTERFACE

TECHNICAL FIELD

The invention relates to electronic packaging. In particular, the invention relates to high density electronic interconnects using grid arrays.

BACKGROUND ART

A grid array interface (GAI) is used as a means for interfacing or connecting high-density integrated circuits (ICs) and/or other high pin-out electronic components or modules to a carrier circuit or to a circuit interconnect in many modern high-density electronic packaging applications. Additionally, GAIs are employed to connect a circuit interconnect to a carrier circuit and occasionally to connect components to components. Examples of such GAIs include, but are not limited to, a ball grid array (BGA) and a pin grid array (PGA). An example of a carrier circuit includes a printed circuit board (PCB) while an example of a circuit interconnect includes a flexible, multi-conductor, interconnect, known as a 'flex' circuit. The GAI provides a high-density, parallel electrical interface between essentially any pair of the electrical component, the carrier circuit, and the circuit interconnect. A circuit interconnect, such as a flex circuit equipped with a GAI, is referred to as a grid array interconnect.

For example, a typical grid array interconnect may comprise a BGA located at one end of a flex circuit. The BGA comprises a first 2-dimensional array of electrical contacts or pads, a second 2-dimensional pad array similar to the first pad array, and an array of conductive bumps or spheroids, typically solder balls, bridging or connecting between the two pad arrays. In particular, the first pad array may be arranged on a connection surface of a circuit element such as, but not limited to, an IC package, an electronic module, or a PCB. The second or 'mating' pad array may be located on a connection surface of the flex circuit to which the circuit element is to be connected. The solder ball array mechanically and electrically connects the first and second pad arrays to one another forming the BGA of the grid array interconnect. A grid array interconnect employing the PGA is similar in concept to the BGA equipped interconnect except that an array of pins replaces the pad array on one of the connection surfaces while the second pad array on the other connection surface is replaced by an array of holes or sockets to receive the pins. The pins also replace the array of bumps or spheroids (i.e., solder balls).

Grid array interconnects are characterized by having an array depth (i.e., a number of rows in the grid array) and a 'pitch' or spacing between columns in the array. Unfortunately in such grid array interconnects, a practical limit to the array depth is often encountered in many cases. To overcome practical array depth limitations, typically either the pitch of the array is increased, additional conductor layers and vias are added to the circuit interconnect, or the circuit interconnect is made wider than the GAI to allow access to rows from sides of the array in addition to an end of the grid array. Increasing pitch tends to decrease an overall density of the array. Adding one or more conductor layers to produce a multilayer circuit allows lower layers to bypass the first rows and access subsequent rows. However, adding layers may greatly increase the cost of the grid array interconnect and may prove impractical or ill advised for certain high frequency applications. Similarly, increasing a width of the circuit interconnect to allow access to the array from multiple sides may not be permissible in some cases, especially where a space for the grid array interconnect is at a premium.

SUMMARY OF THE INVENTION

In accordance with the invention, a flex circuit-based, grid array interconnect having an increased pad array depth of a grid array interface compared to that of a conventional grid array interconnect is facilitated. Moreover, the flex circuit interconnect in accordance with the invention is well-suited for high frequency signal situations such as, but not limited to, when microstrip and/or coplanar wave guide (CPW) transmission lines are employed to carry signals along the flex circuit interconnect.

In accordance with the invention, an achievable depth of the pad array is increased without requiring a multilayer flex circuit and is well suited to microwave applications. In addition, the increased pad array depth is provided without a concomitant increase in the width of the flex circuit interconnect in a vicinity of the pad array. As such, the width of the flex circuit interconnect may be on the order of a width of the grid array interface (GAI) in a vicinity of the pad array. Circuit elements such as, but not limited to, an integrated circuit (IC), electronic module, and a printed circuit board (PCB) or motherboard are connected in accordance with the invention. The pad array is part of the GAI such as, but not limited to, a ball grid array (BGA) and a pin grid array (PGA). These and other features and advantages of the invention are detailed below with reference to the following drawings.

BRIEF DESCRIPTION OF THE DRAWINGS

The various features and advantages of the invention may be more readily understood with reference to the following detailed description taken in conjunction with the accompanying drawings, where like reference numerals designate like structural elements, and in which.

DETAILED DESCRIPTION OF THE INVENTION

Figure 1A:
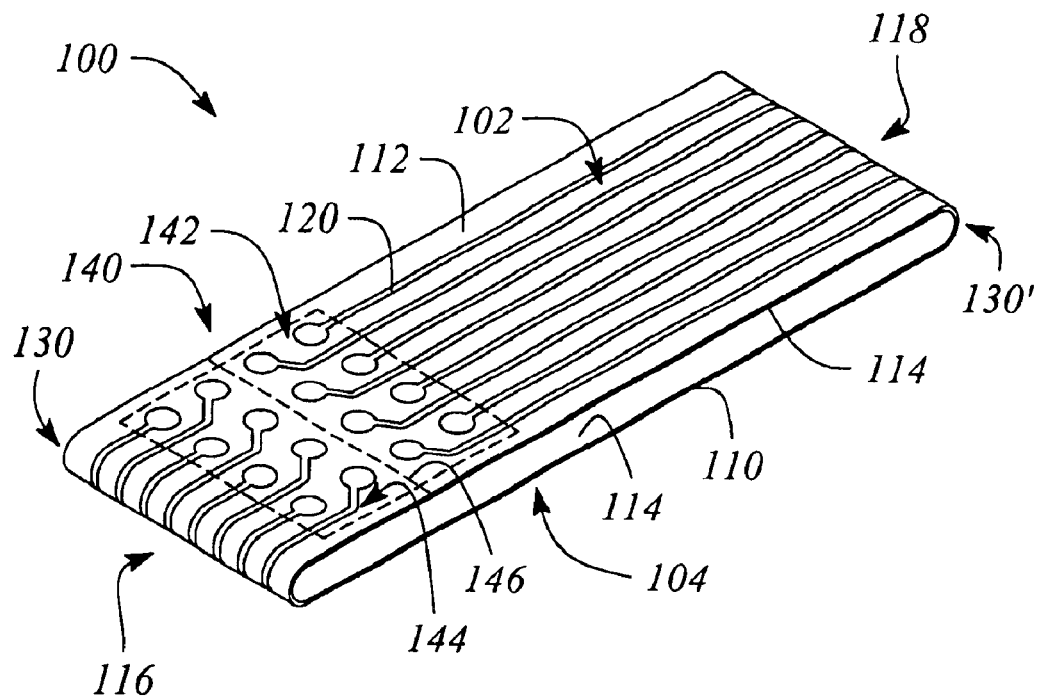
FIG. 1A illustrates perspective view of a folded flex circuit interconnect according to an embodiment in accordance with the invention.
Figure 1B:
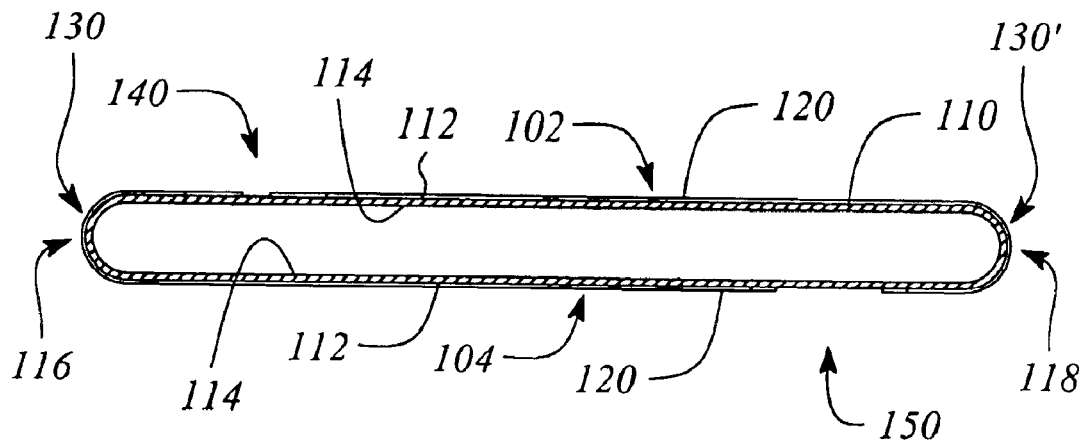
FIG. 1B illustrates a side view of the folded flex circuit interconnect illustrated in FIG. 1A.

FIG. 1A illustrates perspective view of a folded flex circuit interconnect 100 according to an embodiment in accordance with the invention. FIG. 1B illustrates a side view of the folded flex circuit interconnect 100 that is illustrated in FIG. 1A. The folded flex circuit interconnect 100 of the invention facilitates interconnecting a pair of circuit elements. Moreover, the folded flex circuit interconnect 100 provides for an increase in an achievable array depth of a grid array interface (GAI) of the interconnect 100 compared to a conventional flex circuit interconnect by routing electrical traces from the pad array portion of the GAI in two different sets of traces, each set being routed in an essentially opposite direction. A fold in the folded flex circuit interconnect 100 adjacent to a first side of the pad array essentially changes a direction of one of the sets of traces thereby enabling all of the traces to ultimately travel in a similar direction along the folded flex circuit interconnect.

The folded flex circuit interconnect 100 comprises a flexible substrate 110 having a first or 'top' surface 112 and a second or 'bottom' surface 114. The folded flex circuit interconnect 100 further comprises a conductor layer 120 adjacent to the top surface 112 of the flexible substrate 110. In some embodiments, one or more conductor layers 120 in addition to the conductor layer 120 adjacent to the top surface 112 may be included. For example, an additional conductor layer 120 serving as a ground plane may be adjacent to the bottom surface 114 of the flexible substrate 110. A first portion 102 of the folded flex circuit interconnect 100 is essentially parallel to a second portion 104 of the interconnect 100, as illustrated in FIGS. 1A and 1B. The first and second portions 102, 104 are relatively planar extents of the flexible substrate 110 and the conductor layer 120.

The flexible substrate 110 comprises a relatively thin, mechanically pliable, electrically insulating material. In some embodiments, the substrate 110 is intrinsically flexible. In other embodiments, the substrate 110 exhibits mechanical pliability during manufacturing of the folded flex circuit interconnect 100, but is otherwise relatively rigid or a semi-rigid material. Typically, the flexible substrate 110 exhibits mechanical pliability during use. A variety of materials known in the art may be used to fabricate the flexible substrate 110 including, but not limited to, one or more of polyimide, polyester and polytetraflouroethylene (PTFE). In an embodiment in accordance with the invention, the flexible substrate 110 is fabricated from polyimide. However, virtually any material known in the art of printed circuit board manufacture, in particular materials used in the manufacture of flex circuits, is within the scope of the invention.

In general, a thickness of the flexible substrate 110 is much less than a width or a length of the substrate 110. In many embodiments, the flexible substrate 110 typically has a thickness of between 0.03 millimeters (mm) and 1 mm. Also, in general, the width of the flexible substrate 110 typically is less than the length of the substrate 110. Thus for example, the thickness may be approximately 0.1 mm while the width may be on the order of 10 mm and the length may be 100 mm or more, for example. Ultimately however, the thickness, the width and the length of the flexible substrate 110 depend on a particular use or application of the folded flex circuit interconnect 100 and is not intended to be a limitation herein.

The conductor layer 120 comprises electrical tracks or traces typically formed or defined using printed circuit fabrication methods. The conductor layer 120 comprises any conductor material that may be used in printed circuit applications. For example, conductor materials including, but not limited to, copper, gold, aluminum, nickel, solder, and similar metals and metal alloys may be employed. In some embodiments, the conductor layer 120 comprises multiple layers of dissimilar metals. Thus, the conductor layer 120 may comprise a copper layer covered by a nickel layer covered by a gold layer, for example. In some embodiments, the conductor layer 120 is bonded to or fabricated on the flexible substrate 110 using conventional PCB or flex circuit methodologies, including but not limited to, using thermal set adhesives or epoxy adhesives to bond the conductor layer 120 to the flexible substrate 110. In other embodiments, the conductor layer 120 may be deposited onto the flexible substrate 110 using evaporative deposition, sputter deposition, or another method of conductor material deposition. Typically when the conductor layer 120 is deposited onto the substrate 110, an additional layer of the conductor material is deposited on top of an initially deposited conductor material layer using electroplating, for example.

The conductor layer 120 includes one or more electrical traces. The electrical traces are provided to carry electrical signals along the flex circuit interconnect 100. The electrical traces may alternatively carry electrical power or serve as an electrical ground (e.g., ground plane). When two or more conductor layers 120 are present, adjacent layers may cooperate to carry electrical signals. For example, an electrical trace of a first conductor layer 120 may be a microwave transmission line that operates in conjunction with a ground plane of a second conductor layer 120. Types of microwave transmission lines used with respect to the conductor layer 120 may include, but are not limited to, microstrip, coplanar waveguide, fin line, and stripline type transmission lines. Moreover, the transmission lines may be one or both of single-ended transmission lines and differential transmission lines.

The folded flex circuit interconnect 100 further comprises a fold 130 in the flexible substrate 110 and in the adjacent conductor layer(s) 120 at a first end 116 of the flex circuit interconnect 100. The fold 130 at the first end 116 is between the first portion 102 and the second portion 104 of the flex circuit interconnect 100. At the fold 130, the flexible substrate 110 and adjacent conductor layer 120 is bent or folded approximately 180 degrees to achieve essentially parallel first and second portions 102, 104, as illustrated in FIGS. 1A and 1B. In other words, the bottom surface 114 of the flexible substrate 110 in the first portion 102 of the folded flex circuit interconnect 100 is adjacent to and facing the bottom surface 114 of the flexible substrate 110 in the second portion 104 of the folded flex circuit interconnect 100, as a result of the fold 130. For simplicity and not by way of limitation, at least the fold 130 facilitates differentiating the first portion 102 from the second portion 104 of the flex circuit interconnect 100.

Figure 1C:
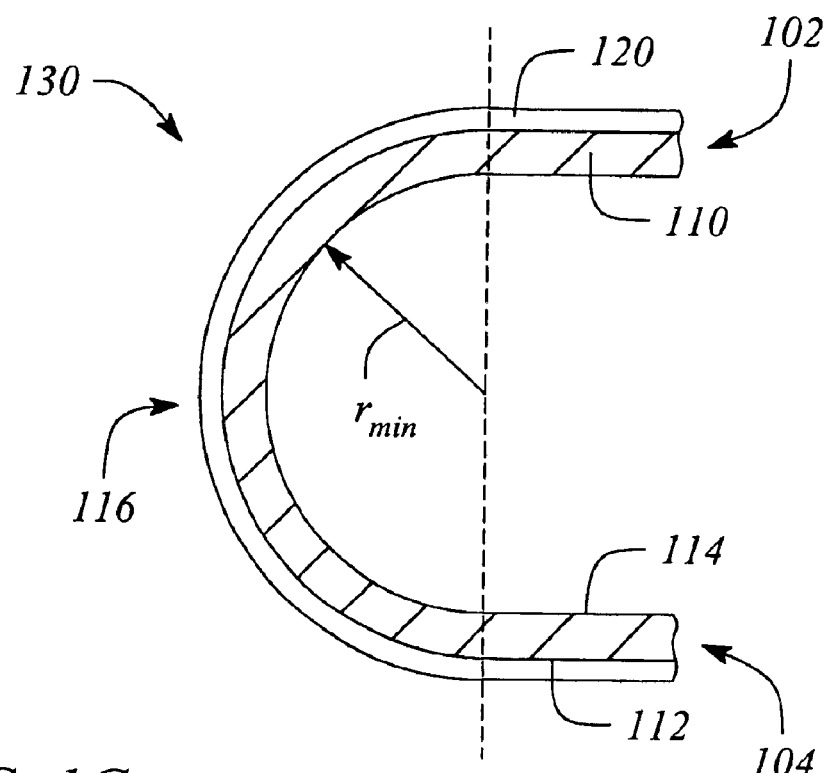
FIG. 1C illustrates a magnified side view of the flex circuit interconnect illustrated in FIG. 1B in a vicinity of a first end of the flex circuit interconnect.

Typically, the fold 130 has a minimum radius $r_{min}$ that is greater than zero. FIG. 1C illustrates a magnified side view of the flex circuit interconnect 100 illustrated in FIG. 1B in the vicinity of the first end 116 of the flex circuit interconnect 100. Generally, the minimum radius $r_{min}$ is determined to minimize a strain on the flexible substrate 110 and adjacent conductor layer(s) 120. In some embodiments, the minimum radius $r_{min}$ is determined in order to facilitate signal transmission in the vicinity of the fold 130. For example, the minimum radius $r_{min}$ may be chosen to minimize an effect of the fold 130 on a high frequency signal propagating along a controlled impedance transmission line, such as a microstrip transmission line of the conductor layer 120. In another example, the minimum radius $r_{min}$ may be chosen to accommodate a given maximum current level being carried by an electrical trace of the conductor layer 120.

The folded flex circuit interconnect 100 further comprises a pad array 140 adjacent to the first end 116 of the flex circuit interconnect 100 within the first portion 102 of the flex circuit interconnect 100. The pad array 140 may be considered a portion of the conductor layer 120, since the pad array 140 comprises an array of conductor pads 140 that interconnect to respective traces of the conductor layer 120. The pad array 140 provides means for an electrical connection between the conductor layer 120 of the folded flex circuit interconnect 100 and a distinct circuit element (not illustrated in FIGS. 1A, 1B and 1C). The circuit element may be, for example, a PCB, such as a motherboard, a subsystem module, an IC package, or any similar device or circuit element used in an electronic system. The pad array 140 is a portion of any type of grid array interface (GAI) including, but not limited to, a ball grid array (BGA) and a pin grid array (PGA). The pad array 140 has any array shape including, but not limited to, a rectangular shape, a polygonal shape, and an essentially circular shape. In an embodiment in accordance with the invention, the pad array 140 is a portion of a ball grid array (BGA) having a rectangular shape. For simplicity of discussion hereinbelow, the pad array 140 will be referred to as a BGA pad array 140 having a rectangular shape without loss of generality with respect to other types of pad arrays 140 that are within the scope of the invention.

According to an embodiment in accordance with the invention, a first set 122 of electrical traces of the conductor layer 120 interfaces with respective pads of the BGA pad array 140 at a first side 142 of the BGA pad array 140. A second set 124 of electrical traces interface with respective pads of the BGA pad array 140 at a second side 144 of the BGA pad array 140. The second side 144 of the BGA pad array 140 is adjacent to the first end 116 of the flex circuit interconnect 100. The first set 122 of electrical traces extend from the respective pads at the first side 142 of the BGA pad array 140 along the first portion 102 of the flex circuit interconnect 100 toward a second end 118 of the flex circuit interconnect 100. The second set 124 of electrical traces extend from the respective pads at the second side 144 of the BGA pad array 140 around the fold 130 and along the second portion 104 toward the second end 118 of the flex circuit interconnect 100. The second side 144 of the BGA pad array 140 is essentially opposite the first side 142 thereof. A hypothetical centerline 146 defines a line through the pad array 140 that separates traces and pads from the first set 122 from traces and pads of the second set 124. However, it is within the scope of the invention for one or more electrical traces from the first set 122 or the second set 124 to interface with respective pads of the BGA pad array 140 on the opposite side, across the hypothetical centerline 146.

Figure 1D:
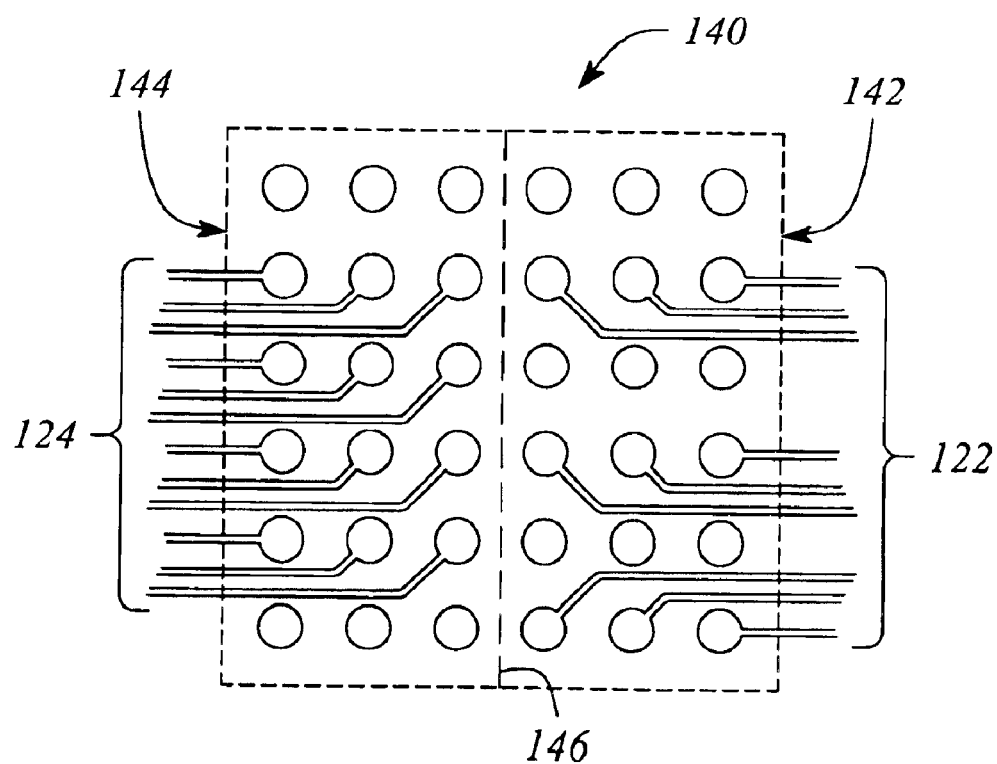
FIG. 1D illustrates a top view of an exemplary embodiment of a ball grid array (BGA) pad array having pads located on either side of a centerline.

FIG. 1D illustrates a top view an exemplary embodiment of the BGA pad array 140 having pads located on either side of the hypothetical centerline 146. Specifically, electrical traces of the first set 122 interface with a respective first set of pads of a portion of the BGA pad array 140 on the first side 142 relative to the centerline 146 while electrical traces of the second set 124 interface with a respective second set of pads of a portion of the BGA pad array 140 on the second side 144 relative to the centerline 146.

Note that, while illustrated as a straight line for simplicity and clarity, the hypothetical centerline 146 separating the interfaced sets 122, 124 of traces and respective pads, may be a meandering line (not illustrated). For example, the centerline 146 is a meandering line when or if an interface density varies across the BGA pad array 140. In particular, some of the electrical traces of the first set 122 may connect to respective pads nearer to (or considered within) the second side 144 of the BGA pad array 140 than to the first side 142.

The folded flex circuit interconnect 100 further comprises an electrical interface 150 adjacent the second end 118 of the folded flex circuit interconnect 100. The electrical interface 150 provides a connection between the second end 118 and another distinct circuit element (not illustrated in FIGS. 1A, 1B and 1C). In particular, when connected to respective circuit elements at both the BGA pad array 140 adjacent to the first end 116 and the electrical interface 150 adjacent to the second end 118, the folded flex circuit interconnect 100 functions as an electrical interconnection between the distinct circuit elements. Essentially, the folded flex circuit interconnect 100 acts in a manner similar to an interconnecting cable between the circuit elements. Advantageously, the distinct circuit elements need not be stacked together or even adjacent to each other for the folded flex circuit interconnect 100 to electrically interconnect them together. For example, the folded flex circuit interconnect 100 may interconnect a subsystem module (not illustrated in FIGS. 1A, 1B and 1C) connected to the electrical interface 150 to a motherboard (not illustrated in FIGS. 1A, 1B and 1C) connected to the BGA pad array 140. See FIGS. 4A and 4B, which are described further below, for example.

Figure 2A:
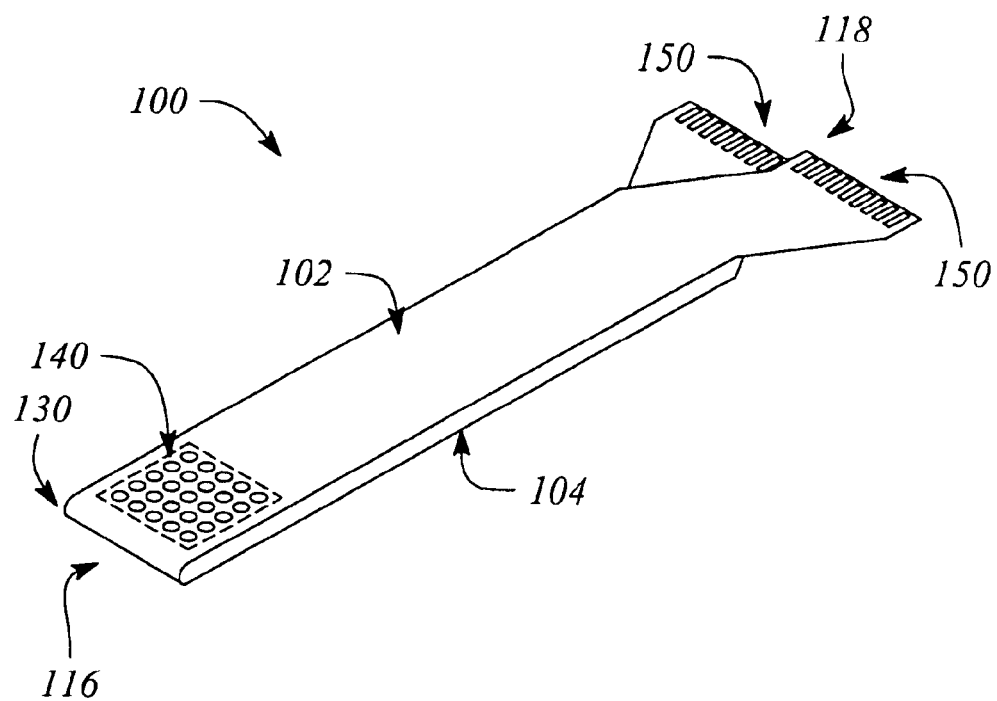
FIG. 2A illustrates a perspective view of an embodiment of a folded flex circuit interconnect having an electrical interface in a linear configuration according to the invention.

The electrical interface 150 may be realized as any one of a wide variety of application specific configurations and still be within the scope of the invention. For example, in some embodiments, the electrical interface 150 may have a linear configuration in which electrical traces of the conductor layer(s) 120 are terminated in connection pads arranged in a linear pattern along end edges at the second end 118. FIG. 2A illustrates a perspective view of an embodiment of the folded flex circuit interconnect 100 having the electrical interface 150 in a linear configuration according to an embodiment in accordance with the invention. As illustrated in FIG. 2A, the electrical interface 150 is divided into two halves, a different one of the halves being included in the first portion 102 and the second portion 104 of the flex circuit interconnect 100, respectively.

Figure 2B:
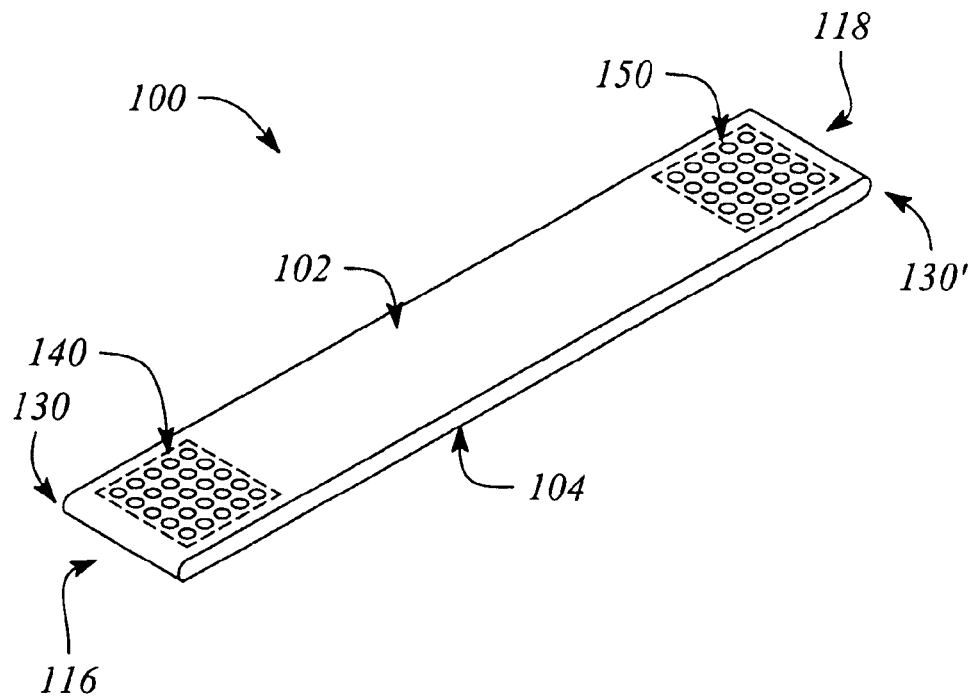
FIG. 2B illustrates a perspective view of an embodiment of a folded flex circuit interconnect having an electrical interface wherein the electrical interface is a BGA pad array according to the invention.

In other embodiments, the electrical interface 150 is essentially located entirely in either the first portion 102 or the second portion 104 of the flex circuit interconnect 100 adjacent to the second end 118. For example, in such embodiments, the electrical interface 150 may include, but is not limited to, a pad array of a BGA, PGA, a single in-line array, dual in-line array, a rectangular edge array, or a combination thereof. FIG. 2B illustrates a perspective view of an embodiment of the folded flex circuit interconnect 100 wherein the electrical interface 150 is a pad array of a BGA according to the invention. As illustrated in FIG. 2B, the BGA electrical interface 150 is located in the first portion 102 of the flex circuit interconnect 100 by way of example. Such an embodiment of the flex circuit interconnect 100 might be used to connect together a pair of PCBs, for example, one PCB at each of the BGA pad array 140 and the BGA electrical interface 150, respectively.

Figure 2C:
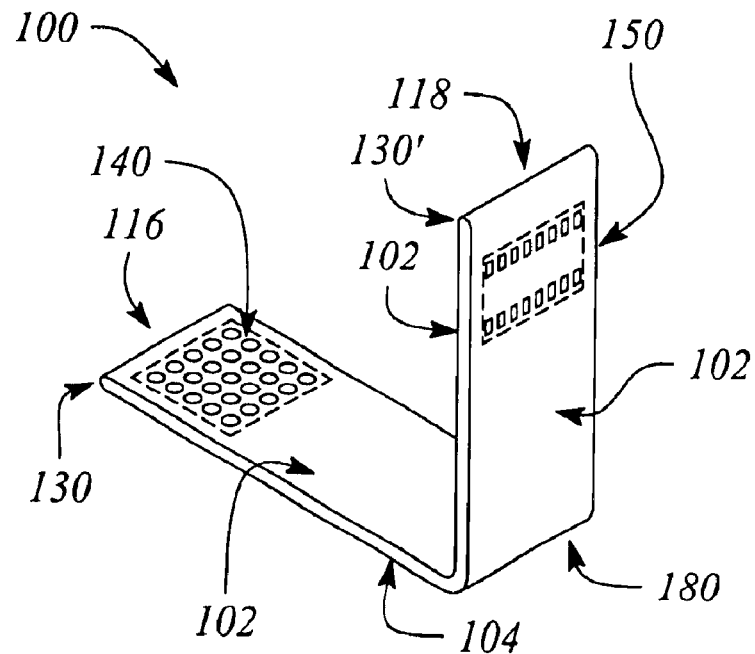
FIG. 2C illustrates a perspective view of a folded flex circuit interconnect having an electrical interface wherein the electrical interface is a dual in-line array according to another embodiment in accordance with the invention.

FIG. 2C illustrates a perspective view of a folded flex circuit interconnect 100 wherein the electrical interface 150 is a dual in-line array according to another embodiment in accordance with the invention. As illustrated in FIG. 2C, the dual in-line array 150 is located in the second portion 104 of the folded flex circuit interconnect 100 adjacent to the second end 118. The dual in-line array 150 may be adapted to accept, mount and electrically connect to one or both of a pin-style or surface mount-style dual in-line package. For example, such an embodiment of the flex circuit interconnect 100 may be used to connect an IC housed in the dual in-line package at the electrical interface 150 near the second end 118 of the flex circuit interconnect 100 to a motherboard at the BGA pad array 140 near the first end 116 of the interconnect 100.

Figure 2D:
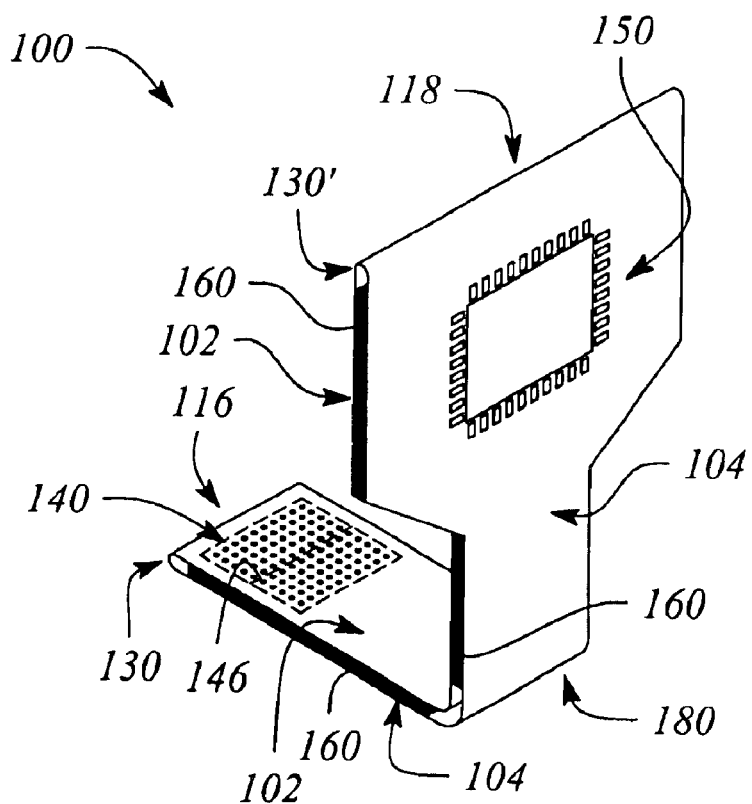
FIG. 2D illustrates a perspective view of a folded flex circuit interconnect having an electrical interface wherein an electrical interface is a rectangular edge array according to another embodiment in accordance with the invention.

FIG. 2D illustrates a perspective view of a folded flex circuit interconnect 100 wherein the electrical interface 150 is a pad array of a rectangular edge array according to another embodiment in accordance with the invention. As illustrated in FIG. 2D, the rectangular edge array 150 is located in the second portion 104 of the folded flex circuit interconnect 100. Such an embodiment of the flex circuit interconnect 100 might be used to connect a subsystem module at the electrical interface 150 to a motherboard at the BGA pad array 140 at respective opposite ends 118, 116, for example. In each of FIGS. 2A–2D, electrical traces of the conductor layer 120 are omitted for simplicity and only contact pads of the electrical interface 150 and the pads of the BGA pad array 140 are illustrated for clarity.

In embodiments having the electrical interface 150 located in either the first or second portions 102, 104, the flex circuit interconnect 100 typically further comprises another or a second fold 130' relative to the first-mentioned fold 130. The second fold 130' is located at the second end 118 of the flex circuit interconnect 100, as illustrated in FIGS. 1A, 1B, 2B, 2C and 2D. The second fold 130' is essentially similar to the first fold 130 at the first end 116 in that the second fold 130' essentially bends the flexible substrate 110 and conductor layer 120 about 180 degrees, is between the first portion 102 and the second portion 104 of the flex circuit interconnect 100, and essentially joins the first and second portions 102, 104 at the second 118. The 'joining' of the first and second portions 102, 104 may be virtual or actual as a result of the second fold 130'. A 'virtual' joining occurs when the folded flex circuit interconnect 100 is fabricated as a continuous 'loop' with no actual or physical break along a length of the flexible substrate 110. An 'actual' joining occurs when the folded flex circuit interconnect 100 is fabricated as a planar strip and then bent or folded to form a 'loop'. In either case, the fold 130' essentially bends the flex circuit interconnect 100 an additional 180 degrees to facilitate joining of the portions 102, 104. Since a fold 130, 130' is present at both ends 116, 118, respectively, which portion 102 or portion 104 of the flex circuit interconnect 100 is called the first or the second portion is arbitrarily chosen and not a limitation herein. Likewise, which end 116, 118 is the first end or the second end is arbitrarily chosen and not a limitation herein.

For embodiments of the folded flex circuit interconnect 100 that employ an actual joining, it is generally necessary to carefully consider where to 'break' the loop formed by the joined flexible substrate 110. In other words, if the folded flex circuit interconnect 100 is to be fabricated as a planar strip and then folded to form a loop, typically a convenient point along the interconnect 100 for the break is selected. Typically, the loop or extent of flexible substrate 110 and conductor layer 120 between the BGA pad array 140 and the electrical interface 150 is not broken at any point. Such a break point would necessitate bridging the electrical traces of the conductor layer(s) 120 during joining and create at least one additional step. Instead, the break point is typically selected to be within either the BGA pad array 140 or the electrical interface 150, such that joining is accomplished while interconnecting to the distinct circuit element.

Figure 3A:
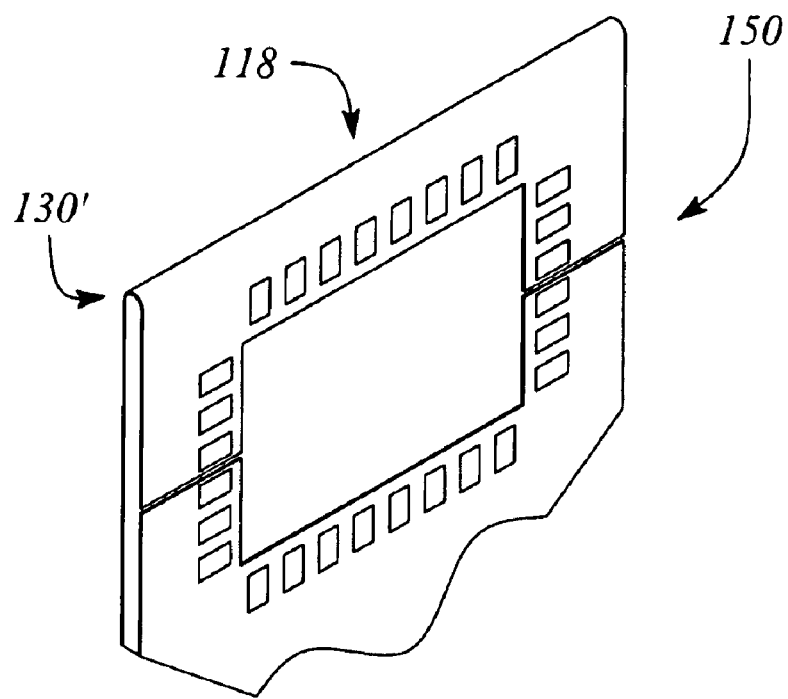
FIG. 3A illustrates an embodiment of a rectangular edge array style electrical interface having a break between an upper half and a lower half of the rectangular edge array.
Figure 3B:
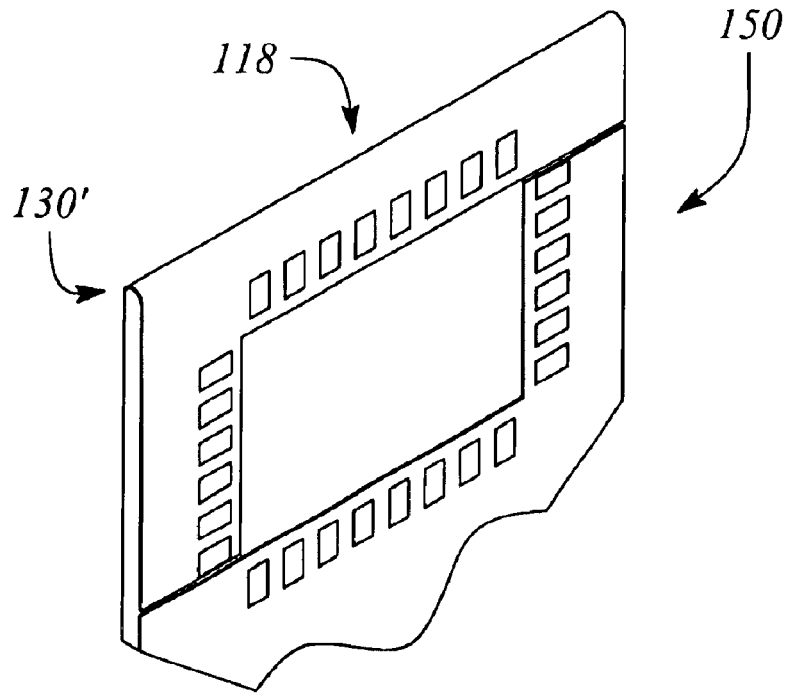
FIG. 3B illustrates another embodiment of a rectangular edge array style electrical interface having a break at diagonally opposite corners.

For example, the break may be located along the centerline 146 (or meanderline) of the BGA pad array 140. Locating the break along the centerline 146 is convenient since by definition herein, no traces traverse the centerline 146, even when the centerline 146 is a meanderline. Therefore, no bridging of electrical traces is required during joining for such a break location. Similarly, a convenient break location within the electrical interface 150 may often be selected. A natural break point exists for the linear configuration of the electrical interface 150 illustrated in FIG. 2D, for example. FIG. 3A illustrates an embodiment of a rectangular edge array style electrical interface 150 having a break between an upper half and a lower half of the rectangular edge array 150. FIG. 3B illustrates another embodiment of a rectangular edge array 150 showing another, often convenient, break location. In other cases, where traces do cross the centerline 146, such as when a connection density within the BGA associated with the pad array 140 is uneven, a break location generally may be determined either therein or elsewhere in the flex circuit interconnect that advantageously does not require bridging. All of such locations are within the scope of the invention. Moreover, although not as desirable, it is within the scope of the invention for a break to be located such that bridging electrical traces or pads is ultimately necessary.

In some embodiments, one or more stiffeners may be employed to provide structural support to the folded flex circuit interconnect 100. In such embodiments, the folded flex circuit interconnect 100 optionally may comprise a stiffener 160. The stiffener 160 may be fabricated of either a conductive or non-conductive material, depending on the embodiment. For example, a conductive metal plate may be used as a stiffener 160 in some embodiments. In addition to providing structural support for the folded flex circuit interconnect 100, the conductive stiffener 160, especially a metal plate conductive stiffener 160, may assist with heat dissipation for circuit elements attached to the BGA pad array 140 and/or the electrical interface 150. Moreover, a conductive stiffener 160 may be used to provide electrical shielding between the first and second portions 102, 104 of the flex circuit interconnect 100. In other embodiments, a non-conductive stiffener 160 may be employed to electrically isolate electrical traces on the adjacent surfaces of the first and second portions 102, 104, respectively. The stiffener 160 is illustrated in FIGS. 2D, 4A, 4B, 5A and 5B.

In addition to those items detailed hereinabove, the folded flex circuit interconnect 100 may also include vias or other similar structures that electrically connect traces or other portions of one conductive layer 120 to one or more other conductive layers 120. Moreover, coatings and additional insulating layers, such as solder masks, may be applied to cover portions of a conductor layer 120 on or adjacent to one or both of the flexible substrate surfaces 112, 114. For example, a protective, insulating coating may be applied to cover the traces of the conductor layer 120 adjacent to the top surface 112 of the flexible substrate 110. Holes or voids in the coating coinciding with pads of the BGA pad array 140 may act as a solder mask to prevent solder balls from shorting adjacent pads during solder reflow. Any of such coatings or even additional layers of the flexible substrate 110 may be employed in conjunction with the folded flex circuit interconnect 100 and still be within the scope of the invention.

Figure 4A:
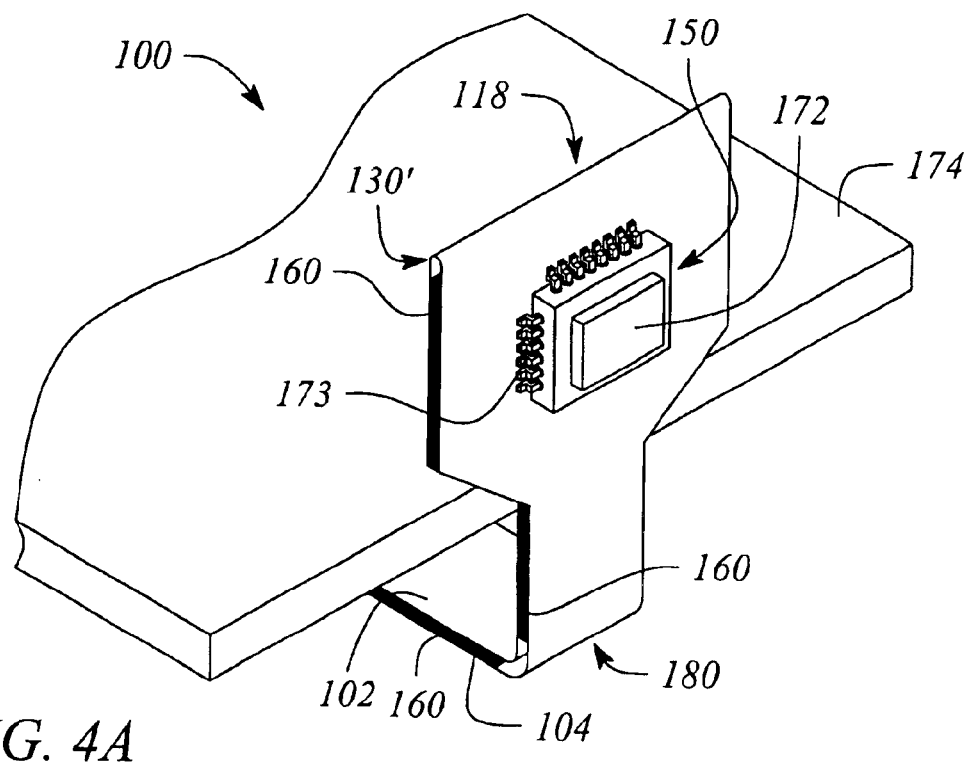
FIG. 4A illustrates a perspective view of an embodiment of a folded flex circuit interconnect connecting a subsystem module to a motherboard according to an embodiment in accordance with the invention.
Figure 4B:
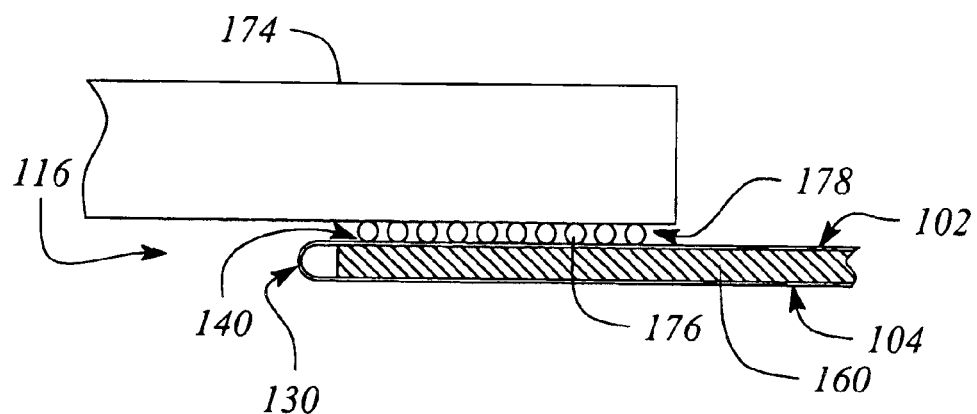
FIG. 4B illustrates a magnified side view of a ball grid array connection between the folded flex circuit interconnect and the motherboard using the folded flex circuit interconnect embodiment illustrated in FIG. 4A.

As mentioned hereinabove, the folded flex circuit interconnect 100 facilitates connecting two distinct circuit elements. FIG. 4A illustrates a perspective view of an embodiment of the folded flex circuit interconnect 100 connecting a subsystem module 172 to a motherboard 174. In particular, the interconnect 100 is illustrated in FIG. 4A as an exemplary connection to a 'first' or 'bottom' side or surface of the motherboard 174. FIG. 4B illustrates a magnified side view of a ball grid connection between the BGA pad array 140 of the folded flex circuit interconnect 100 and the motherboard 174 not illustrated in FIG. 4A. Solder balls 176 are employed to electrically connect the BGA pad array 140 of the folded flex circuit interconnect 100 to a mating BGA pad array 178 of the motherboard 174. In FIG. 4A, the subsystem module 172 is soldered to pads of the rectangular edge array 150 using connection pins 173 of the subsystem module 172 that align with the edge array pads 150.

As illustrated in FIG. 4A, advantage is taken of the flexibility of the flexible substrate 110. In particular, a bend 180 in the folded flex circuit interconnect 100 enables the subsystem module 172 to be positioned at an angle to the motherboard 174 (not limited to the illustrated right angle). FIG. 4A also illustrates the stiffeners 160. The stiffeners 160 are positioned both before and after the bend 180. FIGS. 2C and 2D also illustrate the bend 180, and FIG. 2D also illustrates the stiffeners 160. While illustrated in FIGS. 2D and 4A as before and after the bend 180 by way of example, the stiffeners 160 may be located anywhere in the folded flex circuit interconnect 100 and still be within the scope of the invention. In particular, a location of the stiffeners 160 typically is dictated by a particular implementation of the folded flex circuit interconnect 100.

Figure 4C:
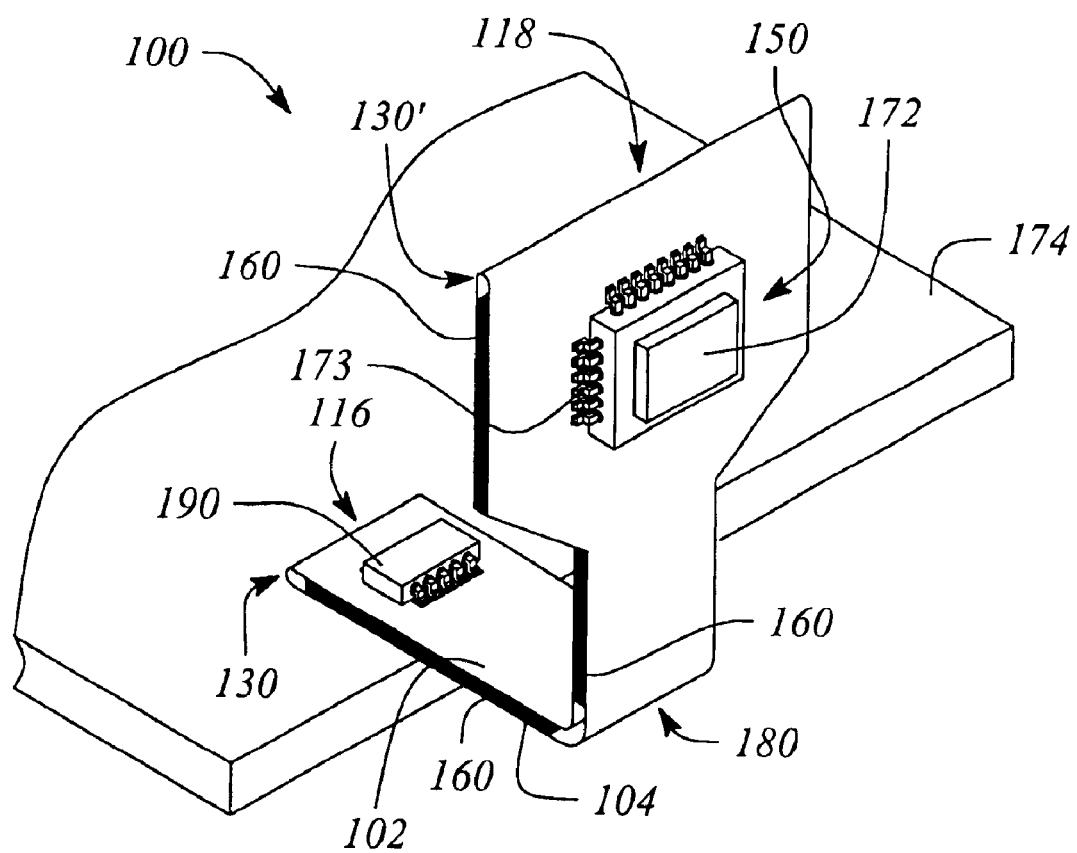
FIG. 4C illustrates a perspective view of an embodiment of a folded flex circuit interconnect connecting a subsystem module to a motherboard according to another embodiment in accordance with the invention.

FIG. 4C illustrates a perspective view of an embodiment of a folded flex circuit interconnect connecting a subsystem module to a motherboard according to another embodiment in accordance with the invention. In particular, FIG. 4C illustrates the folded flex circuit interconnect 100 as having an exemplary connection to a 'second' or 'top' side or surface of the motherboard 174. The connection employs a grid array interface comprising a BGA pad array 140 of the folded flex circuit interconnect 100 connecting to a mating BGA pad array of the motherboard 174 using solder balls (not illustrated). Advantageously unlike other flex circuit interconnects known in the art, the folded flex circuit interconnect 100 allows the BGA pad array 140 to be located on either the first or second portions 102, 104 of the interconnect 100, such that flexibility to connect to either the top side or the bottom side of the motherboard 174 is provided.

In addition, the folded flex circuit interconnect 100 optionally may comprise one or more electrical interfaces in addition to the electrical interface 150 for one or more electrical components (i.e., additional distinct circuit element(s)). For example, an electrical component 190 may be mounted to an additional interface located in the first portion 102 adjacent to the first fold 130, as illustrated in FIG. 4C. The additional interface(s) may be any of the electrical interface types described above for the electrical interface 150, or a different interface. The electrical component 190 may be a driver circuit or a clock and data recovery circuit, for example, or another distinct circuit element. In practice, such additional electrical components 190 may provide any number of functions and may be mounted to respective additional interfaces located essentially anywhere along a length of the folded flex circuit interconnect 100 in one or both of the first portion 102 and the second portion 104.

Figure 5A:
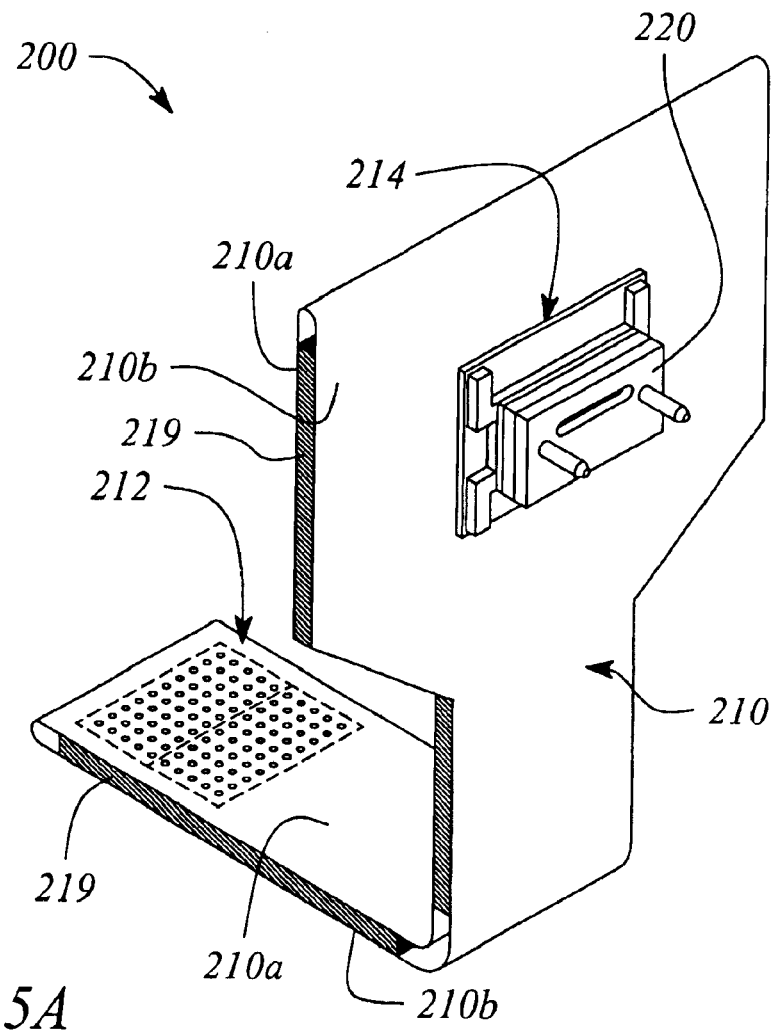
FIG. 5A illustrates an optics module that employs a folded flex circuit interconnect according to the invention.
Figure 5B:
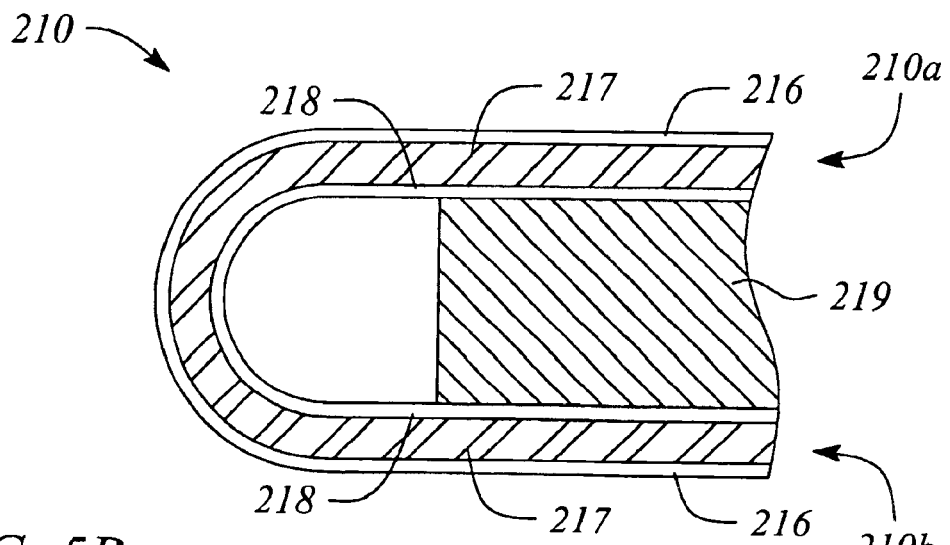
FIG. 5B illustrates a magnified cross section of a portion of the folded flex circuit interconnect illustrated in FIG. 5A.

FIG. 5A illustrates an optics module 200 that employs a folded flex circuit interconnect 210 according to an embodiment in accordance with the invention. FIG. 5B illustrates a magnified cross section of a portion of the folded flex circuit interconnect 210 illustrated in FIG. 5A. The optics module 200 transmits and/or receives multiple optical signals from an optical fiber communications channel. The optics module 200 converts the received optical signals into high frequency electrical signals. The high frequency electrical signals are communicated to a motherboard (not illustrated) for processing. The connection to the motherboard is provided by a BGA pad array 212 located at, near or adjacent to an end of the folded flex circuit interconnect 210. For example, with the exception of the folded flex circuit interconnect 210 of the invention, the optics module 200 may be essentially similar to that described by Giboney et al., U.S. Pat. No. 6,318,909 B1, incorporated herein by reference. The folded flex circuit interconnect 210 may be essentially similar to the folded flex circuit interconnect 100 described hereinabove.

In particular, the optics module 200 comprises an optical unit 220 such as, but not limited to, a high channel count optical unit 220. The optical unit 220 may be an optical receiver, an optical transmitter, or an optical transceiver. For example, the optical unit 220 may be a chip mounted enclosure (CME) essentially similar to that described by Giboney et al. U.S. Pat. No. 6,351,027 B1, incorporated herein by reference. The optical unit 220 is connected to a rectangular edge array 214 of the folded flex circuit interconnect 210 that is at, near or adjacent to an end opposite to the end nearest to the BGA pad array 212. Package pins (not illustrated) of the optical unit 220 may be connected to pads (not illustrated) of the rectangular edge array 214 utilizing any conventional connection technology including, but not limited to wire bonding, soldering, and conductive adhesive bonding. Moreover, solder balls are employed in conjunction with the BGA pad array 212 to connect the folded flex circuit interconnect 210 to a mating BGA pad array of the motherboard (not illustrated). Microstrip transmission line traces 216 of the folded flex circuit interconnect 210 (illustrated in FIG. 5B but omitted in FIG. 5A for clarity) connect the rectangular edge array 214 to the BGA pad array 212. A ground plane 218 of the folded flex circuit interconnect 210 (also illustrated in FIG. 5B but omitted in FIG. 5A for clarity) connects through the rectangular edge array 214 to a ground of the optical unit 220 and through the BGA pad array 212 to a ground of the motherboard. A flexible substrate 217 separates and supports the microstrip traces 216 and the ground plane 218. The microstrip traces 216 and the ground plane 218 extend along opposite surfaces of the flexible substrate 217 of both a first portion 210a and a second portion 210b of the folded flex circuit interconnect 210. Typically, the microstrip traces 216 run along a top or outer surface of the folded flex circuit interconnect 210 while the ground plane 218 runs along a bottom or inner surface of the folded interconnect 210.

The optical unit 220 receives and/or transmits optical signals from one or more signal channels carried by one or more fiber optic lines or fibers (not illustrated). For example when the optical unit 220 receives optical signals, the optical signals are converted by the optical unit 220 into high frequency, electrical signals. The electrical signals are carried by the microstrip transmission line traces 216 of the folded flex circuit interconnect 210 to the motherboard for processing. Similarly when the optical unit 220 transmits optical signals, electrical signals from the motherboard are carried by the microstrip transmission line traces 216 to the optical unit 220. In the optical unit 220, the electrical signals are converted into optical signals and transmitted into the fiber optic line(s). When the optical unit 220 is a transceiver, the optical unit 220 both transmits and receives the optical signals.

For example, the one or more channels may be carried by multiple parallel optical fibers, each fiber corresponding to a channel. In another example, a single fiber may contain multiple channels each channel being carried by a separate wavelength or frequency (e.g., wavelength division multiplexing). In yet another example, the multiple channels may be carried by a combination of multiple, parallel fibers one or more of which carry multiple channels. In the last example, the optical unit 220 may be referred to as a parallel optics, wave division multiplexed optical unit 220.

Stiffeners 219 between the first and second portions 210a, 210b help to provide structural support to the folded flex circuit interconnect 210. In addition, in a vicinity of the optical unit 220, the stiffener 219 may also serve as a heat sink. Alternatively, a separate heat sink (not illustrated) may be incorporated into the folded flex circuit interconnect 210 to assist in dissipating heat generated by the optical unit 220.

The optics module 200 includes all of the features and advantages described above for the folded flex circuit interconnect 100. For example, the embodiment of the optics module 200 illustrated in FIG. 5A also includes a bend in the folded flex circuit interconnect 210. The bendability of the folded flex circuit interconnect 210 advantageously accommodates a variety of orientations of the optical unit 220 relative to the motherboard for ultimate interconnection.

Thus, there have been described various embodiments of in accordance with the invention that interconnect distinct circuit elements. In particular, a folded flex circuit interconnect and an optics module that incorporates a folded flex circuit interconnect have be described. It should be understood that the above-described embodiments are merely illustrative of some of the many specific embodiments that represent the principles of the invention. Those skilled in the art can readily devise numerous other arrangements without departing from the scope of the invention.

What is claimed is:

1. A circuit interconnect comprising:
    a substrate having a fold at a first end of the interconnect; and
    a conductor layer supported by the substrate, the conductor layer comprising a high frequency transmission line, and a pad array of a grid array interface adjacent to the first end, the transmission line being connected to a pad of the pad array,
    wherein the fold is between a first portion and a second portion of the interconnect such that the first portion is essentially parallel to the second portion along a length of the interconnect extending away from the fold, and wherein the interconnect connects distinct circuit elements together without essentially vertically stacking the elements for interconnection.

2. The circuit interconnect of claim 1, wherein a material of the substrate is selected from a flexible or pliable material, a rigid material and a semi-rigid material that is foldable.

3. The circuit interconnect of claim 1, wherein the pad array is an array of interconnection pads, the pad array being a portion of the grid array interface, the grid array interface being selected from a ball grid array and a pin grid array.

4. The circuit interconnect of claim 1, further comprising:
    a stiffener that supports the substrate, the stiffener being between the first portion and the second portion adjacent to a surface of the substrate opposite to a surface that supports the transmission line and the pad array.

5. The circuit interconnect of claim 1, further comprising a bend in the first portion and the second portion that changes an orientation of the first end relative to a second end of the interconnect that is opposite to the first end.

6. The circuit interconnect of claim 1, wherein the conductor layer further comprises:
    an electrical interface adjacent to a second end of the interconnect, the second end being opposite to the first end, the electrical interface being connected to the transmission line.

7. The circuit interconnect of claim 6, wherein the pad array and electrical interface are adjacent to a surface of the substrate exterior to a space between the parallel first and second portions, the pad array being in the first portion and the electrical interface being in one or both of the first portion and the second portion.

8. The circuit interconnect of claim 7, further comprising another conductor layer supported by a surface of the substrate interior to the space between the parallel first and second portions.

9. The circuit interconnect of claim 7, wherein the electrical interface is one or more of a portion of a grid array interface selected from ball grid array and a pin grid array, a dual in-line array and a four-sided or rectangular edge array.

10. The circuit interconnect of claim 7, further comprising a bend that changes an orientation plane of one of the electrical interface adjacent to the second end and the pad array adjacent to the first end relative to the other.

11. The circuit interconnect of claim 7, wherein the pad array connects to a first circuit element adjacent to the first end of the interconnect, the electrical interface connecting to a second circuit element adjacent the second end of the interconnect, the distinct circuit elements being a distance apart about equal to or less than the length of the circuit interconnect.

12. The circuit interconnect of claim 1, wherein the substrate has another fold at a second end of the interconnect, the second end being opposite the first end, such that the first portion and the second portion are between the folds, the substrate essentially forming a loop.

13. A folded flex circuit interconnect comprising:
    a flexible substrate having a first fold at a first end of the interconnect and second fold at a second end of the interconnect opposite the first end; and
    a conductor layer supported by the substrate, the conductor layer comprising one or more electrical traces and a pad array of a grid array interface, the pad array being adjacent to the first end and connected to one or more of the electrical traces, wherein a first portion and a second portion of the interconnect are between the first fold and the second fold such that the first portion is essentially parallel to the second portion and the substrate essentially forms a loop, and wherein the folded flex circuit interconnect connects distinct circuit elements together without vertically stacking the elements for interconnection.

14. The flex circuit interconnect of claim 13, wherein one or more of the electrical traces is a transmission line that supports one or both of microwave and millimeter wave signal propagation.

15. The folded flex circuit interconnect of claim 13, further comprising a bend that changes an orientation plane of one of the first end and the second end relative to the other.

16. The folded flex circuit interconnect of claim 13, wherein the substrate and conductor layer are fabricated as an essentially planar structure having two separate termination ends, the structure being subsequently folded such that the two separate termination ends are brought together in proximity to one another to form the interconnect.

17. The folded flex circuit interconnect of claim 13, wherein the conductor layer further comprises:

an electrical interface adjacent to the second end of the interconnect, the electrical interface being connected to one or more of the electrical traces.

18. The folded flex circuit interconnect of claim 17, wherein the pad array and electrical interface are adjacent to a surface of the substrate exterior to a space between the parallel first and second portions, the pad array being in the first portion and the electrical interface being in one or both of the first portion and the second portion.

19. The folded flex circuit interconnect of claim 17, wherein the grid array interface is selected from a ball grid array and a pin grid array, and wherein the electrical interface is one or more of a portion of another grid array interface selected from ball grid array and a pin grid array, a dual in-line array and a four-sided or rectangular edge array.

20. The folded flex circuit interconnect of claim 17, wherein the conductor layer further comprises:

another electrical interface between the first end and the second end of the interconnect, the other electrical interface being connected to one or more of the electrical traces.

21. An optics module comprising:

an optical unit; and a folded flex circuit interconnect having a first portion and a second portion between a first fold at a first end of the interconnect and a second fold at a second end of the interconnect opposite the first end, the first portion being essentially parallel to the second portion along a length of the interconnect, wherein the folded flex circuit interconnect connects the optical unit to a motherboard without vertically stacking the optical unit and the motherboard together for such interconnection.

22. The optics module of claim 21, wherein the folded flex circuit interconnect carries high frequency signals between the interconnected motherboard and optical unit, the high frequency signals being one or both of microwave and millimeter wave frequency signals.

23. The optics module of claim 21, wherein the optical unit is one of an optical transmitter, an optical receiver, and an optical transceiver.

24. The optics module of claim 21, wherein the folded flex circuit interconnect comprises a pad array of a grid array interface located in the first portion adjacent to the first fold, and an electrical interface located in one or both of the first portion and the second portion adjacent to the second fold, the pad array connecting to the motherboard, the electrical interface connecting to the optical unit.

25. The optics module of claim 24, wherein the folded flex circuit interconnect further comprises a conductor layer comprising an electrical trace, the electrical trace connecting the pad array to the electrical interface.

26. The optics module of claim 25, wherein the electrical trace comprises a high frequency transmission line selected from a microstrip transmission line, a coplanar waveguide, a stripline transmission line, and a fin line transmission line.

27. The optics module of claim 24, wherein the grid array interface is selected from a ball grid array and a pin grid array, the electrical interface being one of a portion of a grid array interface selected from a ball grid array and a pin grid array, a rectangular edge array and a dual in-line array.

28. The optics module of claim 24, wherein the folded flex circuit interconnect further comprises another electrical interface located in one of the first portion and the second portion between the first fold and the second fold, the other electrical interface connecting to an electrical component.

29. The optics module of claim 21, wherein the folded flex circuit interconnect comprises:

a conductor layer supported by a substrate, the conductor layer comprising an electrical trace;

a pad array of a grid array interface supported by the substrate adjacent to the first end of the interconnect, the pad array having a first interconnection pad connected to the electrical trace of the conductor layer;

an electrical interface supported by the substrate adjacent to the second end of the interconnect, the electrical interface having a second interconnection pad connected to the electrical trace of the conductor layer, wherein the conductor layer carries signals between the optical unit and the motherboard.

* * * * *